United States Patent
Maruyama et al.

(10) Patent No.: US 7,145,250 B2
(45) Date of Patent: Dec. 5, 2006

(54) LSI PACKAGE, LSI ELEMENT TESTING METHOD, AND SEMICONDUCTOR DEVICE MANUFACTURING METHOD

(75) Inventors: Shigeyuki Maruyama, Kawasaki (JP); Toru Nishino, Kawasaki (JP); Kazuhiro Tashiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 4 days.

(21) Appl. No.: 11/113,063

(22) Filed: Apr. 25, 2005

(65) Prior Publication Data
US 2005/0189649 A1      Sep. 1, 2005

Related U.S. Application Data

(63) Continuation of application No. PCT/JP03/06298, filed on May 20, 2003.

(51) Int. Cl.
  *H01L 29/40*   (2006.01)
  *H01L 23/48*   (2006.01)
  *H01L 23/52*   (2006.01)
(52) U.S. Cl. .................. 257/778; 257/781; 438/614
(58) Field of Classification Search .............. 257/780, 257/781, 778, 784, 786; 438/613, 614
  See application file for complete search history.

(56) References Cited

U.S. PATENT DOCUMENTS

| | | | | |
|---|---|---|---|---|
| 4,930,001 A * | 5/1990 | Williams | .................... | 257/737 |
| 5,367,195 A * | 11/1994 | DiGiacomo et al. | ......... | 257/767 |
| 5,844,320 A * | 12/1998 | Ono et al. | .................... | 257/778 |
| 6,249,051 B1 * | 6/2001 | Chang et al. | ................ | 257/737 |
| 6,483,195 B1 * | 11/2002 | Aoki et al. | .................. | 257/778 |
| 6,917,118 B1 * | 7/2005 | Omori et al. | ................ | 257/778 |
| 6,972,495 B1 * | 12/2005 | Fjelstad | ....................... | 257/778 |
| 2005/0098883 A1 * | 5/2005 | Hanke | ......................... | 257/737 |
| 2005/0110161 A1 * | 5/2005 | Naito et al. | ................. | 257/778 |
| 2006/0060981 A1 * | 3/2006 | Paulus | ......................... | 257/778 |

FOREIGN PATENT DOCUMENTS

| | | |
|---|---|---|
| JP | 5-190599 | 7/1993 |
| JP | 9-8442 | 1/1997 |
| JP | 10-335375 | 12/1998 |

(Continued)

*Primary Examiner*—S. V. Clark
(74) *Attorney, Agent, or Firm*—Westerman, Hattori, Daniels & Adrian, LLP.

(57) ABSTRACT

An LSI package comprises an LSI element and a wiring board. The plurality of pin terminals of the LSI element each includes a first conductive layer and a second conductive layer superposed on the first conductive layer. The plurality of pin terminals of the wiring board each includes a third conductive layer joined to the second conductive layer, and the wiring board further comprises outer joining terminals. The first, second, and third conductive layers are made of materials causing the metallic bond between the second conductive layer and third conductive layer to be stronger than the metallic bond between the first conductive layer and second conductive layer. The LSI element is tested using the outer joining terminals of the wiring board. The second conductive layer and third conductive layer are joined to attain a metallic bond through aggregation derived from pressure, and are reliably brought into electrical contact with each other for a test. After the test is completed, the terminals of the LSI element are peeled off from the terminals of the wiring board. At this time, the second conductive layer is transferred to the third conductive layer, and the first conductive layer is left intact in each of the terminals of the LSI element. The LSI element is then mounted on another wiring board.

20 Claims, 11 Drawing Sheets

FOREIGN PATENT DOCUMENTS

| JP | 11-64389 | 3/1999 |
| JP | 2000-39452 | 2/2000 |
| JP | 2001-56347 | 2/2001 |
| JP | 2001-237277 | 8/2001 |

* cited by examiner

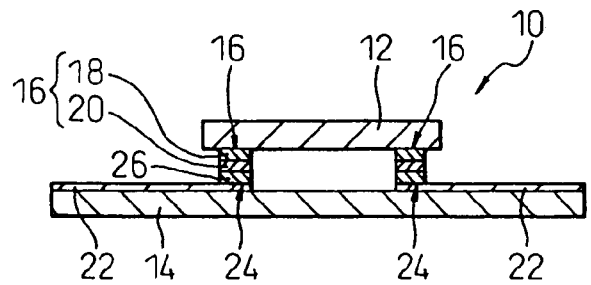
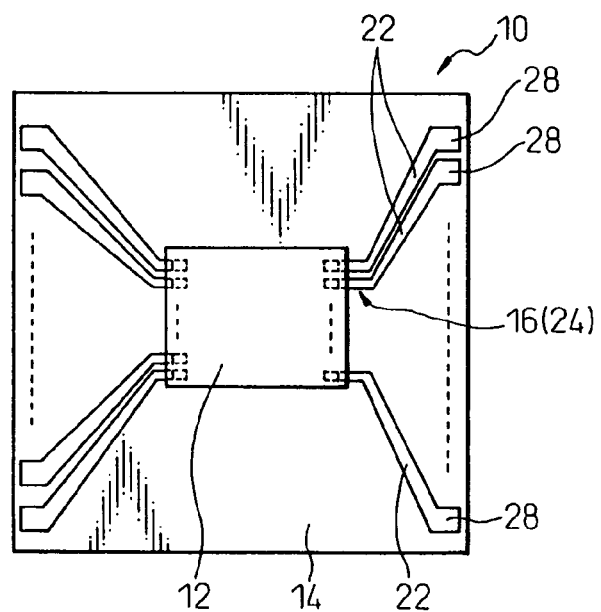
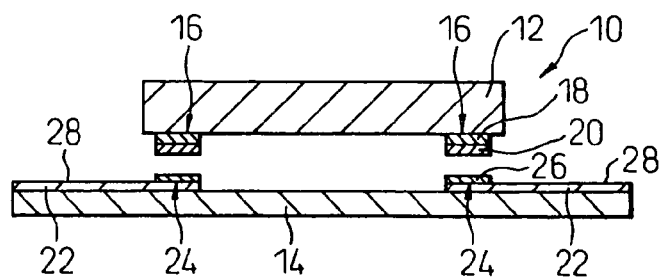

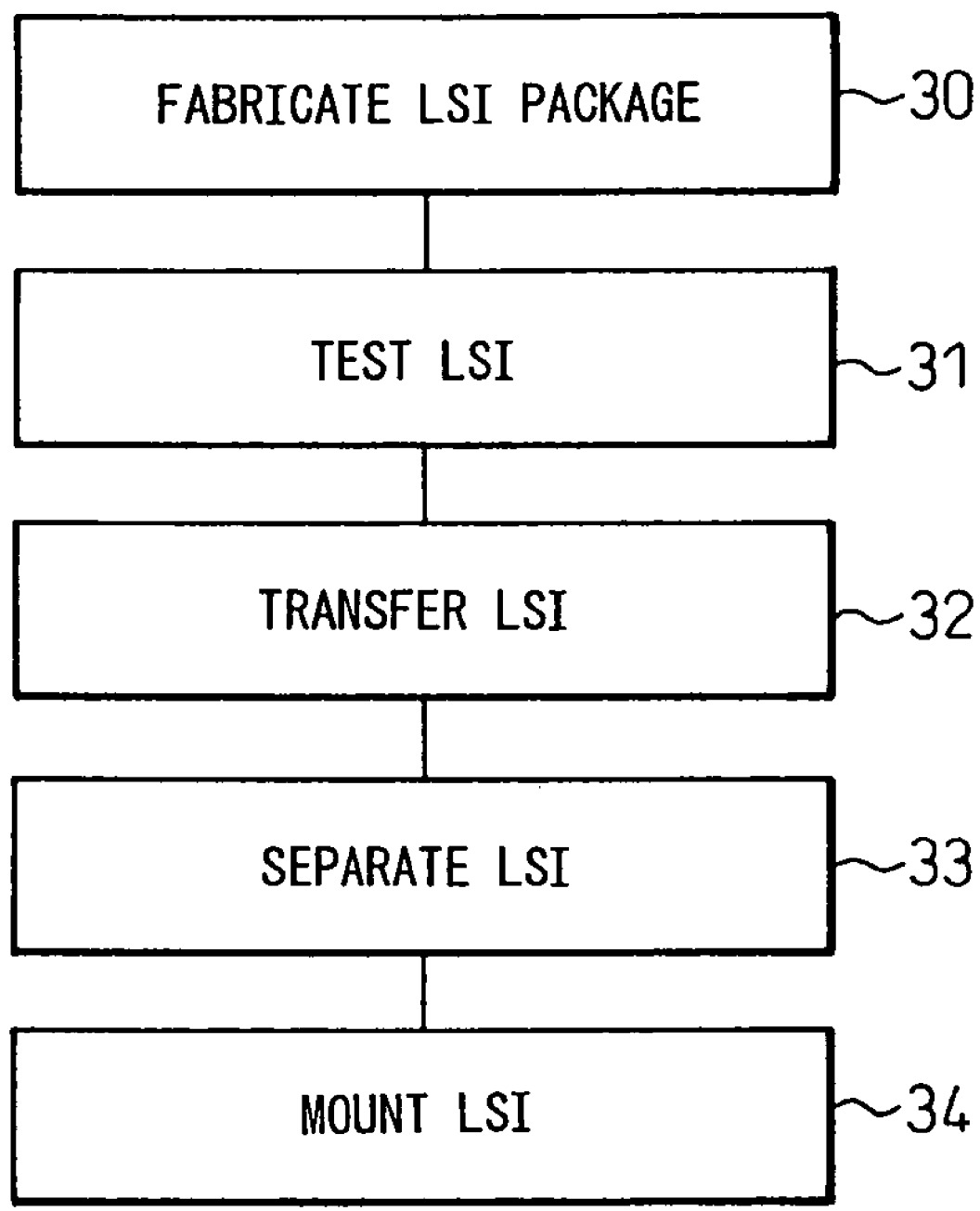

LSI PACKAGE, LSI ELEMENT TESTING METHOD, AND SEMICONDUCTOR DEVICE MANUFACTURING METHOD

CROSS-REFERENCE TO RELATED APPLICATION

This is a Continuation of Application No. PCT/JP03/06298 filed on May 20, 2003. The entire disclosure of the prior application is hereby incorporated, by reference, herein in its entirety.

BACKGROUND OF THE INVENTION

1. Field of the Invention

The present invention relates to an LSI package, an LSI element testing method, and a semiconductor device manufacturing method. More particularly, the present invention is concerned with an electrical test on an LSI element, having minute terminals, such as an LSI chip, an LSI wafer, or a chip-size package (CSP), and the manufacture of a semiconductor device having the LSI element incorporated therein.

2. Description of the Related Art

Conventionally, an LSI package is fabricated by mounting an LSI chip on a wiring board, a final test is conducted on the LSI in the state of the LSI package, the LSI package is delivered to a user, and the user incorporates the LSI package in any of various types of devices. In recent years, what is called a known good die (KGD) has increasingly adopted as a form of delivery in which an LSI chip or LSI wafer is delivered to a user as it is.

For example, in order to cope with a demand for downsizing of various types of devices, a use form called bare-chip mounting has been adopted for directly installing an LSI chip in any of various types of devices. Moreover, in order to cope with a demand for downsizing and a higher capability, a use form called a multi-chip module (MCM), a multi-chip package (MCP), or a system-in package (SIP) has been adopted for incorporation of a plurality of LSI chips in one package. In any of these forms, a known good die (KGD) is needed.

Conventionally, testing that used to be conducted after an LSI chip was fabricated in the form of any of various packages had to be conducted in the state of an LSI chip or an LSI wafer. However, the pitch between adjoining ones of terminals of the LSI chip or LSI wafer is very small (for example, 100 µm or less) and is smaller than the pitch between adjoining ones of terminals of a wiring board. The size of each of the terminals of the LSI chip or LSI wafer becomes minute in proportion to the pitch. Consequently, a testing socket or a probe card must be able to reliably come into contact with the terminals of the LSI chip or LSI wafer. The requirements for the testing socket or probe card have become very strict.

In many cases in which the KGD is needed, downsizing and high-density mounting are required. The thickness of the LSI chip or LSI wafer must therefore be decreased. As the LSI chip or LSI wafer gets thinner, more damage, including cracking, are likely to occur due to contact force or an impact stemming from manufacture.

Moreover, a problem with regard to the KGD is implementation of a burn-in test. The burn-in test (acceleration test intended to remove defective goods at an initial stage) requires a long processing time of, for example, seven to eight hours. Numerous sockets or probe cards are therefore needed in order to conduct the burn-in test on numerous LSI elements. Consequently, how to provide the burn-in test socket or probe card at a low cost is a problem that must be solved conventionally. However, as the requirements for the test socket or probe card gets stricter, it becomes harder to provide it at a low cost.

For example, Japanese Unexamined Patent Publication (Kokai) Nos. 11-064389, 2000-039452, and 2001-056347 have disclosed examples of a probe card employed in a wafer capability test. However, these probe cards are costly to manufacture. There is difficulty in preparing numerous probe cards for a burn-in test. It is impossible to deliver the probe cards together with LSI elements.

As mentioned above, LSI elements such as LSI wafers or LSI chips are becoming thinner. Therefore, the LSI elements are prone to damage. In order to attain stable electric contact for a test, considerable pressing force must be applied to the pin terminals of an LSI element and a socket. Therefore, it will presumably get harder to attain stable contact without cracking or other damage to the wafer or chip. Moreover, the terminals of the LSI element may be damaged by a probe.

There is a fear that the thus tested LSI element or, more particularly, a tested thin LSI chip may be damaged during transportation. The problem concerning an impact on the tested LSI element occurring during transportation after the delivery at a factory will become more significant.

In particular, the important functions (important factors for assessing an LSI element) which are required for testing the LSI element in order to realize a KGD are (a) assessing the capability of an LSI package to come into contact with a tester (stable electrical contact), (b) assessing the freedom in the position of a contact portion of an LSI package (whether the position of the contact portion can be determined irrespective of the arrangement of terminals or the pitch between adjoining ones thereof), (c) assessing the capability of an LSI package to protect an LSI element (to check if an LSI element is damaged or the mounting capacity of an LSI element is degraded due to a contact flaw or the like), (d) assessing a cost, (e) assessing the ease of manufacture (ease of setting an LSI package in a socket or resetting it), (f) assessing the applicability to a wide area (applicability to any chip or wafer, or a large wafer), and the like.

As for a testing method, there are, broadly, a temporary contact method and a tentative mounting method. The temporary contact method is a method of pressing an LSI element and a socket for electrical contact of the pin terminals of the LSI element with the pin terminals of the socket without fusing or joining the terminals of the LSI element and the terminals of the socket. Once pressing force is released, the terminals of the LSI element can be separated from those of the socket.

However, the temporary contact method requires application of strong pressing force to each contact point for stable electrical contact on a contact interface (for example, 10 g/pin or more). The reason why such strong force is required is to enlarge the actual contact area of the contact interface and to prevent constriction resistance. Furthermore, as the surface of each terminal has a contaminant or an oxide layered thereon, the terminal must be brought into contact with an associated terminal by breaking the layer of the contaminant or oxide.

Namely, the temporary contact method cannot deter occurrence of an electrical resistance called contact resistance. The contact resistance is attributable to two major factors described below. The first factor is the presence of constriction resistance. As an actual contact area (contact point area) is small, current is concentrated on a very small portion that is in contact with another portion. This causes the constriction resistance. When pressing force is weakened, a contact area by which terminals are in contact with one another decreases. Consequently, the constriction resistance increases, and the electrical resistance increases. Eventually, the contact becomes unstable. Therefore, a strong pressing force is needed.

The second factor is the presence of film resistance. Each of terminals has a high-resistance layer, and a contaminant such as an oxide or an organic compound layered over the surface of each of terminals is the high-resistance layer. The resistance (ranging from several tens of ohms to several megaohms) offered by the high-resistance layer is much larger than the electrical resistance (ranging from several tens of milliohms to several ohms) of the material of the terminals. Theoretically, the film resistance is proportional to the product of the thickness of the film and the resistivity of the film. However, in general, the film resistance may have significant influence on a test of the LSI element and also, the film resistance per se is unstable. Therefore, in a normal test, the film of the high-resistance layer is broken or pierced in order to bring each terminal into contact with an associated terminal. Thus, the adverse effect is prevented. A strong pressing force (for example, 10 g/pin or more) is needed in order to prevent the adverse effect of the film (to break or piece the film).

A socket employed in the temporary contact method is rigid and large as a whole. This is intended to protect an LSI element and the socket itself from being deformed due to a large load the socket produces or receives. Accordingly, the cost of the socket is high. The larger the number of pin terminals included in an LSI element is, the more severe the issue of the high cost is. For example, when pressing force of 15 g/pin is applied, if the number of pin terminals a chip has is 60, the pressing force is 0.9 kg/chip. If the number of pin terminals a chip has is 1000, the pressing force is 15 kg/chip. If a wafer is 8 inch wide and has 50000 pin terminals, the pressing force is 750 kg/chip. The socket and its housing are required to have rigidity large enough to withstand the large pressing force.

The tentatively mounting method is a method of tentatively mounting an LSI element on a wiring board, conducting a test using outer terminals of the wiring board, and then separating the LSI element from the wiring board. In this case, the pin terminals of an LSI are fused and joined with the outer terminals of the wiring board (by creating an alloy with heat). Without strong pressing force, the LSI terminals and the outer terminals of the wiring board come into electrically stable contact with each other. Unlike the temporary contact method, the housing of a socket need not be large or rigid enough to withstand strong pressing force. Only the wiring board is, substantially, needed.

However, once the pin terminals of an LSI element are fused and joined with the outer terminals of a wiring board, it is hard to peel off the terminals of the LSI element from the outer terminals of the wiring board after the completion of a test. If the terminals of the LSI element are peeled off from the outer terminals of the wiring board, the terminals of the LSI element may be damaged. This poses a problem in that the damaged LSI element cannot be mounted in an intended wiring board. When wire bonding is adopted, the remaining wires become obstacles. When bump bonding is adopted, the mounting capacity of the LSI element is impaired due to the deformation of bumps, a change in a volume, or deterioration derived from heat of a solder. When the terminals of the LSI element are peeled off from the outer terminals of the wiring board, part of a material made into the outer terminals of the wiring board is transferred (or stuck) to the terminals of the LSI element. This impairs the mounting capacity of the LSI element. In contrast, there is a concern that part of the terminals of the LSI element may be stuck on to the outer terminals of the wiring board.

When the pin terminals of an LSI element are fused and joined with the outer terminals of a wiring board, an alloy results from each pair of the terminals.

Consequently, the LSI element and the terminals of the LSI element are thermally stressed. If the coefficient of linear expansion of an LSI chip is not equal to that of a wiring board, a difference from the temperature at which the LSI chip is mounted on the wiring board (when the LSI chip is preserved at room temperature or tested) is manifested as a difference in a dimension. This causes the LSI element and wiring board to warp. Accordingly, not only the state of contact becomes unstable but also a thinned LSI chip or LSI wafer may be internally cracked. Moreover, as mentioned previously, as the joining terminals are thermally stressed, they are basically oxidized or carbonized, or have the composition thereof changed (thermally deteriorated). Compared with the terminals of an LSI element that has not been tentatively mounted, the mounting capacity of the LSI element is poor.

In short, according to the temporary contact method, terminals are readily separated from each other but strong pressing force is needed. In contrast, according to the tentative mounting method, electrical contact can be attained but it is hard to separate terminals from each other. Consequently, for prevalence of the KGD, stable electrical contact must be attained without strong force and terminals must be separable from each other. Moreover, measures must be taken for fear that after terminals are separated from each other, the terminals of an LSI element may be remarkably deformed or the mounting capacity of the LSI element later may be impaired. Furthermore, the necessity of applying high-temperature heat for joining terminals or separating terminals from each other is required to be obviated.

SUMMARY OF THE INVENTION

Accordingly, an object of the present invention is to provide an LSI package, an LSI element testing method, and a semiconductor device manufacturing method permitting an LSI element to be tested and supplied to a user.

An LSI package in accordance with the present invention comprises at least one LSI element having a plurality of pin terminals and a wiring board having a plurality of pin terminals. Each of the terminals of the LSI element has a first conductive layer, and a second conductive layer superposed on the first conductive layer. Each of the terminals of the wiring board has a third conductive layer joined with the second conductive layer of each of the terminals of the LSI element. The first, second, and third conductive layers are made of materials causing the metallic bond between the second conductive layer and third conductive layer to be stronger than the metallic bond between the first conductive layer and second conductive layer. The wiring board further comprises a plurality of outer joining terminals connected to the plurality of terminals of the wiring board with wires.

An LSI element testing method in accordance with the present invention comprises: a step of providing an LSI element with a plurality of pin terminals each having a first conductive layer and a second conductive layer superposed on the first conductive layer; a step of forming on a wiring board a plurality of pin terminals each having a third conductive layer, and a plurality of outer joining terminals connected to the plurality of terminals with wires; a step of joining the terminals of the LSI element with the terminals of the wiring board so that the second conductive layers will be bonded to the third conductive layers; and a step of testing the LSI element using the outer joining terminals of the wiring board. The first, second, and third conductive layers are made of materials causing the metallic bond between the second conductive layer and third conductive layer to be stronger than the metallic bond between the first conductive layer and second conductive layer.

A semiconductor device manufacturing method in accordance with the present invention comprises: a step of providing an LSI element with a plurality of pin terminals each having a first conductive layer and a second conductive layer superposed on the first conductive layer; a step of forming on a wiring board a plurality of pin terminals each having a third conductive layer, and a plurality of outer joining terminals connected to the plurality of terminals with wires; a step of joining the plurality of terminals of the LSI element with the plurality of terminals of the wiring board so that the second conductive layers will be bonded to the third conductive layers; a step of testing the LSI element using the plurality of outer joining terminals of the wiring board; a step of transporting the LSI element and wiring board to a position different from a position of testing; a step of peeling off the plurality of terminals of the LSI element from the plurality of terminals of the wiring board; and a step of joining the plurality of terminals of the LSI element with the plurality of terminals of another wiring board. The first, second, and third conductive layers are made of materials causing the metallic bond between the second conductive layer and third conductive layer to be stronger than the metallic bond between the first conductive layer and second conductive layer.

In the foregoing constituent features, each of the pin terminals of an LSI element has two or more conductive layers. The second conductive layer made of a material which is different from a material made into the first conductive layer and whose wettability relative to the material of the first conductive layer is poor is superposed on or joined with the first conductive layer. A material which is identical to the material of the second conductive layer that is the uppermost layer of each of the terminals of the LSI element or whose wettability relative to the material of the second conductive layer is good is adopted as a material to be made into the third conductive layer that is the uppermost layer of each of the terminals of the wiring board. Consequently, the metallic bond between the second conductive layer and third conductive layer is stronger than the metallic bond between the first conductive layer and second conductive layer.

The terminals of the LSI element and the terminals of the wiring board are pressured and joined each other in an uncontaminated state (state devoid of a layer of an oxide or an organic film). As for uncontaminated materials of the same nature, even if they are not fused with heat to produce an alloy, a phenomenon of agglutination occurs due to molecular motion or molecular binding. Consequently, the uncontaminated materials are united and electrically stably brought into contact with each other. Therefore, after the terminals are joined, although strong pressing force is not imposed, constriction resistance hardly occurs.

After a test is completed, if force is imposed in a direction in which the terminals of the LSI element peel off from the terminals of the wiring board, the terminals of the LSI element peel off with the first conductive layers thereof separated from the second conductive layers thereof. The second conductive layers are persistently joined with the terminals of the wiring board through agglutination. Therefore, the second conductive layers stick on to the terminals of the wiring board, and the terminals of the LSI element have the first conductive layers thereof alone left intact.

Consequently, although strong pressing force is not imposed, terminals are joined each other through agglutinative binding. Therefore, stable electrical contact is attained and low resistance is realized. In order to separate the terminals from each other, when force is exerted in peeling off the terminals, the first conductive layer is separated from the second conductive layer. The terminals are therefore readily separated from each other. After the separation is completed, a new layer bared through peeling is exposed. Therefore, the capacity of an LSI element to be mounted on another wiring board later will not be degraded. Neither a remaining wire bond nor a contact flaw will be detected. Moreover, as no heat is applied, the material of the terminals does not thermally deteriorate. The entire LSI element remains unaffected by thermal distortion, and can be mounted on another wiring board without any problem.

BRIEF DESCRIPTION OF THE DRAWINGS

The present invention will be described below with reference to appended drawings, wherein:

FIG. 1 is a sectional view showing an LSI package in accordance with an embodiment of the present invention;

FIG. 2 is a plan view showing the LSI package shown in FIG. 1;

FIG. 3 is a sectional view showing the LSI package shown in FIG. 1 and having an LSI element thereof held unmounted on a wiring board;

FIG. 4 is a flowchart describing a semiconductor device manufacturing method in accordance with the present invention;

DESCRIPTION OF THE PREFERRED EMBODIMENTS

Figure 5:
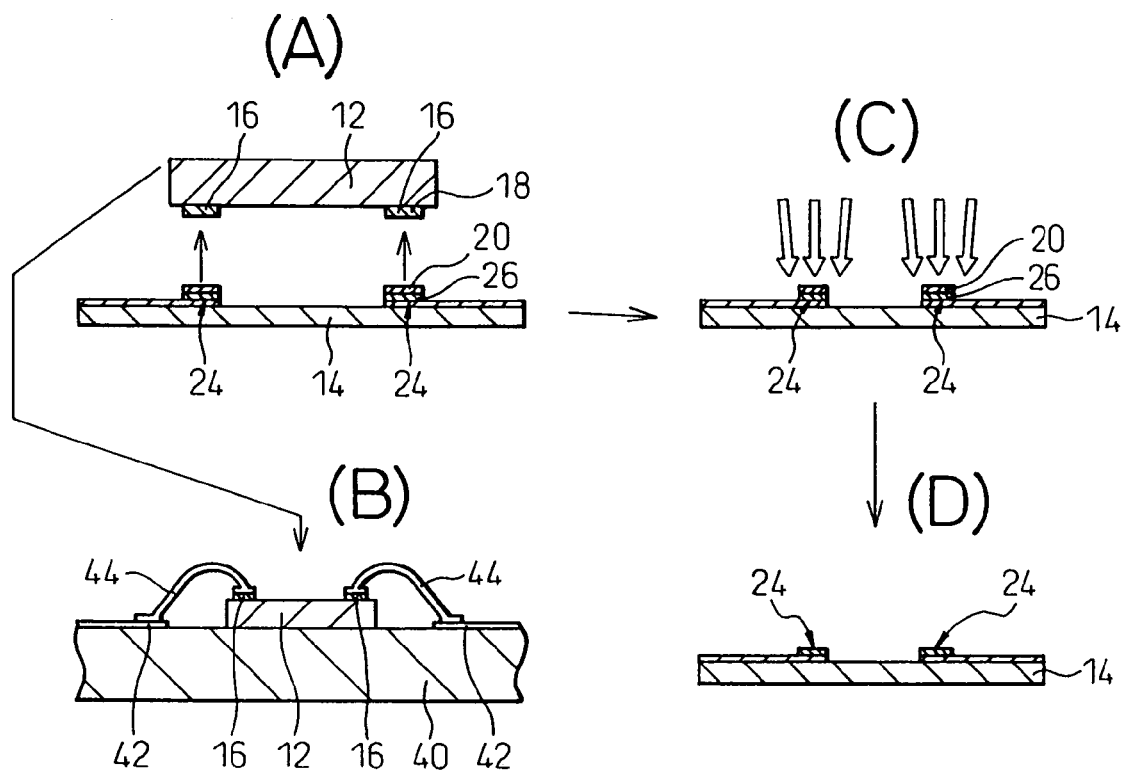
FIG. 5 shows an example of a semiconductor device having an LSI element mounted on another wiring board.

FIG. 1 is a sectional view showing an LSI package in accordance with an embodiment of the present invention. FIG. 2 is a plan view showing the LSI package shown in FIG. 1. FIG. 3 is a sectional view showing the LSI package that is shown in FIG. 1 and has an LSI element thereof left unmounted on a wiring board.

Referring to FIG. 1 to FIG. 3, an LSI package 10 comprises an LSI element 12, and a wiring board 14 having the LSI element 12 mounted thereon. In the present embodiment, the LSI element 12 is a silicon chip. However, the LSI element 12 may be a semiconductor chip, a semiconductor wafer, or a semiconductor component having minute terminals, such as, a chip-size package (CSP). The wiring board 14 is formed with a polyimide (sometimes abbreviated to "PI") substrate. The wiring board 14 may be formed with a glass epoxy substrate or any other substrate.

The LSI element 12 has a plurality of pin terminals 16. Each of the terminals 16 comprises a first conductive layer 18 formed on the surface of the LSI element 12, and a second conductive layer 20 superposed on the first conductive layer 18. The second conductive layer 20 exhibits, by its nature, poor wettability relative to the first conductive layer 18.

The wiring board 14 comprises wires 22, and a plurality of pin terminals 24 formed on the wires 22. Each of the terminals 24 has a third conductive layer 26 as a superficial layer thereof. The third conductive layers 26 of the plurality of terminals 24 of the wiring board 14 are joined with the second conductive layers 20 of the terminals 16 of the LSI element 12, and are made of the same material as the second conductive layers 20 or a material that exhibits good wettability relative to the material of the second conductive layers.

According to the present invention, the first conductive layer 18, second conductive layer 20, and third conductive layer 26 are made of materials causing the metallic bond between the second conductive layer 20 and third conductive layer 26 to be stronger than the metallic bond between the first conductive layer 18 and second conductive layer 20. Incidentally, each of the terminals 16 of the LSI element 12 has a base (passivation) layer, and the first conductive layer 18 is included in the base layer. The metallic bond between the first conductive layer 18 and second conductive layer 20 is weaker than the metallic bond between the base layer and first conductive layer 18.

For example, the first conductive layers 18 of the terminals 16 of the LSI element 12 are made of aluminum, and the second conductive layers 20 thereof are made of tungsten (W). Aluminum and tungsten are coated over the LSI element 12 by performing sputtering or the like. The third layers 26 that are the uppermost layers of the terminals 24 of the wiring board 14 are made of the same material as the second conductive layers 20 that are the uppermost layers of the terminals 16 of the LSI element 12, that is, tungsten. A flexible printed circuit board made of PI (polyimide), that is a material made into an insulating substrate, may be adopted as the wiring board 14.

Moreover, the first conductive layers 18 of the terminals of the LSI element 12 are made of solder, and the second conductive layers 20 are made of Pt (or Rd or W). The third conductive layers 26 of the terminals 24 of the wiring board 14 are made of PT (or Rd or W).

Outer joining terminals 28 are formed on the portions of the wires 22 located on the perimeter of the wiring board 14. The pitch between adjoining ones of the outer joining terminals 28 of the wiring board 14 is larger than the pitch between adjoining ones of the terminals 16 of the LSI element 12.

When it comes to the LSI package 10, the outer joining terminals 28 of the wiring board 14 are used to test the LSI element 12. In this case, for example, the LSI package 10 is inserted into a testing socket, and the outer joining terminals 28 of the wiring board 14 are coupled to contacts included in the testing socket. In this case, a conventional testing socket can be utilized nearly perfectly. On the other hand, when an attempt is made to test the LSI element 12 in the form of a bare chip, if the LSI element 12 has been downsized or sophisticated, the pitch between adjoining ones of the terminals 16 of the LSI element 12 is very small. Therefore, a test socket having contacts arranged with a very small pitch between adjoining contacts must be procured. This is expensive.

FIG. 4 is a flowchart describing a semiconductor device manufacturing method in accordance with the present invention. At step 30, the LSI package 10 is fabricated. The LSI package 10 is identical to the one described with reference to FIG. 1 to FIG. 3. At step 31, the outer joining terminals 28 of the wiring board 14 are used to test the LSI element 12. For testing of the LSI element 12, a testing socket is employed as mentioned previously.

Thereafter, at step 32, the LSI package 10 is transported. In this case, a manufacturer of the LSI element 12 fabricates the LSI packages 10, and tests the LSI element 12. If the results of the test are satisfactory, the LSI package 10 is transported to a user (delivered). At step 33, the user separates the LSI element 12 from the wiring board 14 (peels the terminals 16 of the LSI element 12 from the terminals 24 on the wiring board 14). Thereafter, at step 34, the user mounts the LSI element 12 on any desired type of wiring board.

Users want the LSI element 12 to be supplied in the form of a bare chip, a bare wafer, or a CSP. This is a delivery form called a known good dice (KGD) and adapted to electronic parts. In this case, for example, the LSI element 12 is mounted as a bare chip directly on a wiring board included in electronic equipment. Otherwise, the LSI element 12 may be used in the form of a multi-chip module (MCM), a multi-chip package (MCP), or a system-in package (SIP).

The wiring board 14 is included for the purpose of testing the LSI element 12. After the manufacturer of the LSI element 12 tests the LSI element 12, the manufacturer of the LSI element 12 may separate the wiring board 14 from the LSI element 12 and then deliver the LSI element 12 alone. However, transporting the LSI element 12 together with the wiring board 14 as the LSI package 10 is more helpful in protecting the LSI element 12 than transporting the LSI element 12 alone.

FIG. 5 shows an example of a semiconductor device having the LSI element 12 mounted in another wiring board after being separated from the wiring board 14. Referring to FIG. 5, (A) shows a state in which the LSI element 12 is separated from the wiring board 14 at the step 33 described in FIG. 4. The first conductive layer 18 appears on the surface of each of the terminals 16 of the LSI element 12.

(B) shows a state in which the separated LSI element 12 is mounted on another wiring board 40. In this state, the plurality of terminals 16 of the LSI element 12 are connected to a plurality of terminals 42 of the wiring board 40 with wires 44, that is, joined to the plurality of terminals 42 by performing wire bonding. (C) shows a step of cleaning (ashing) the separated terminals 24 of the wiring board 14. The terminals 24 have the third conductive layers 26. Since the second conductive layers 20 are stuck on to the third conductive layers 26, the terminals 24 are cleaned in order to remove the second conductive layers 20 from the third conductive layers 26. (D) shows the cleaned wiring board 14. The cleaned wiring board 14 is reused.

At a testing step, the first conductive layers 18 made of aluminum are neither flawed nor heated at a high temperature. The wire-bonding capacity will not be impaired. Normally, a preliminary test that is conducted in the state of a wafer causes a contact flaw to remain in the terminals of an LSI wafer. According to the present method, such a flaw will not remain on the surfaces of the terminals but the mounting capacity is kept stable. As for the terminals of the LSI wafer, a trace of a probe poses a problem and the frequency by which the LSI wafer can be brought into contact with the probe is limited. The present method does not pose such a problem. The bonding capacity will not be impaired despite repetition of a retest.

Figure 6:
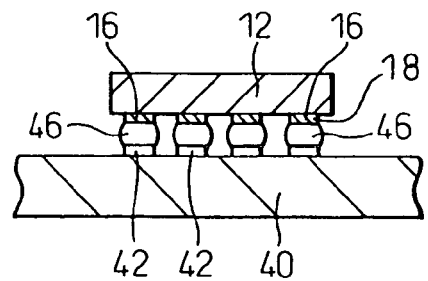
FIG. 6 shows another example of the semiconductor device shown in FIG. 5.

FIG. 6 shows another example of the semiconductor device shown in FIG. 5. In this example, a plurality of pin terminals 16 of an LSI element 12 is joined to a plurality of pin terminals 42 of a wiring board 40 via bumps 46. The bumps 46 are formed on the terminals 16 of the LSI element 12 after the LSI element 12 is separated from the wiring board 14. In this case, Au is adopted as a material to be made into the first conductive layers 18 of the terminals 16 of the LSI element 12, and W is adopted as a material to be made into the second conductive layers 20 (not shown in FIG. 6). The bumps 46 are solder bumps. The solder is available in various compositions. For example, a high fusing-point solder (Pb:Sn=95:5) is available.

According to the present invention, as mentioned above, the first conductive layer 18, second conductive layer 20, and third conductive layer 26 are made of materials causing the metallic bond between the second conductive layer 20 and third conductive layer 26 to be stronger than the metallic bond between the first conductive layer 18 and second conductive layer 20. In particular, at least the third conductive layer 26 serving as the superficial layer of each of the terminals 24 of the wiring board 14 is made of the same material as the second conductive layer 20 of each of the terminals 16 of the LSI element 12 or a material exhibiting good wettability relative to the material of the second conductive layer. Preferably, the second conductive layer 20 of each of the terminals 16 of the LSI element 12 and the third conductive layer 26 of each of the terminals 24 of the wiring board 14 are joined to attain a metallic bond through an action of aggregation derived from pressure. Preferably, the surfaces of the second conductive layers of the terminals 16 of the LSI element 12 and the surfaces of the third conductive layers 26 of the terminals 24 of the wiring board 14 are cleaned prior to the step of joining the terminals 16 and terminals 24.

Figure 7:
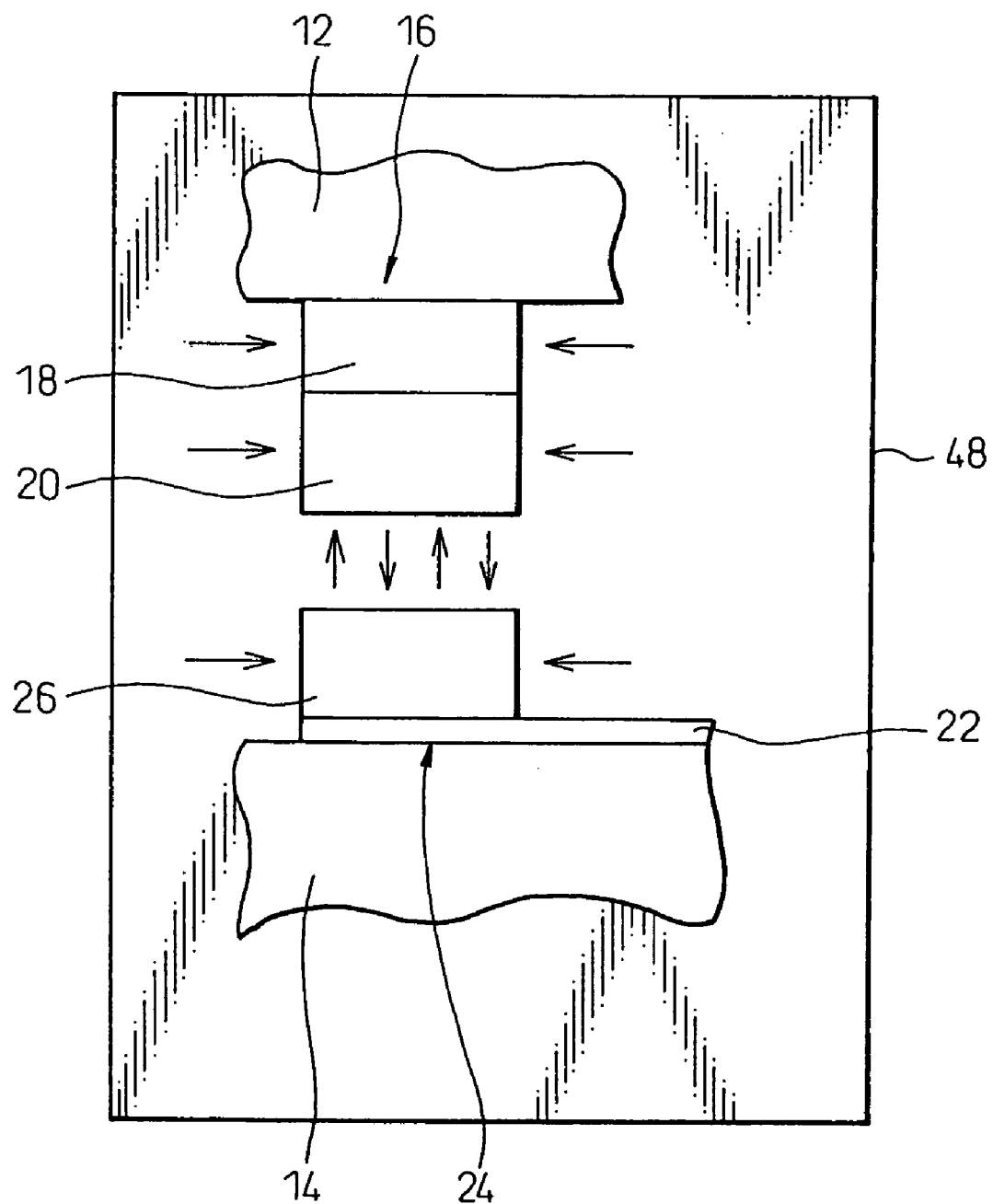
FIG. 7 shows ashing to be performed for cleaning terminals.

FIG. 7 shows ashing to be performed in order to clean the terminals. Ashing is achieved by inserting the LSI element 12 and wiring board 14 into a chamber 48 and feeding, for example, a fluorine gas in a plasma atmosphere. Note that ashing is not limited to this example. Moreover, the LSI element 12 and wiring board 14 need not entirely be cleaned through ashing. At least the surfaces of the second conductive layers 20 and third conductive layers 26 should be ashed.

Immediately after the surfaces of the second conductive layers 20 and third conductive layers 26 are thus cleaned, and layers of an oxide and other impurities are removed, the terminals 16 of the LSI element 12 and the terminals 24 of the wiring board 14 are pressed to join them. Thus, when the terminals 16 of the LSI element 12 and the terminals 24 of the wiring board 14 are pressed with relatively small pressure but not heated (or heated at temperature lower than the fusing point), the surfaces of the second conductive layers 20 and the surfaces of the third conductive layers 26 are joined to attain a metallic bond. Preferably, for the pressure and joint of the terminals 16 of the LSI element 12 and the terminals 24 of the wiring board 14, the ashing chamber 48 and a pressure joint system are disposed in the same processing room and the processing room is brought to a vacuum or an inert gas (nitrogen) atmosphere.

Figure 8A:
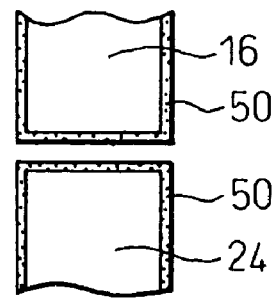
FIG. 8A to FIG. 8C show an example of a procedure of joining terminals of an LSI element with terminals of a wiring board.
Figure 8B:
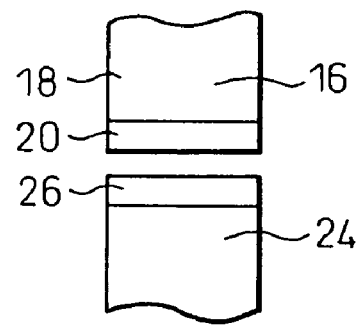
Figure 8C:
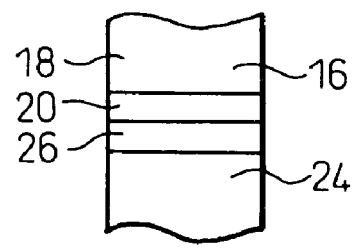

FIG. 8A to FIG. 8C show an example of join between each of the terminals 16 of the LSI element 12 and each of the terminals 24 of the wiring board 14. As shown in FIG. 8A, a film 50 of an oxide or an organic compound is likely to be formed over the surface of the terminal 16 or 24. When the surface of the terminal 16 or 24 is covered with the film 50 of an oxide or organic compound, even if the (second conductive layer 20 of) terminal 16 is brought into contact with the (third conductive layer 26 of) terminal 24, the film resistance between them increases. As for electrical connection of the terminal 16 to the terminal 24, if the terminals are brought into contact with each other by applying pressure, a large pressing force must be applied in order to establish a state of contact that is stable enough to test an LSI. Moreover, a contact force proportional to the number of pins must be continuously applied. According to the present invention the terminals 16 and 24 are preferably, as shown in FIG. 8C, joined with the surfaces thereof (especially, the surfaces of the second conductive layer 20 and third conductive layer 26), as shown in FIG. 8B, cleaned or kept uncontaminated.

If the second conductive layers 20 serving as the superficial layers of the pin terminals 16 of the LSI element 12 and the third conductive layers 26 serving as the superficial layers of the pin terminals 24 of the wiring board 14 are made of the same material and that both the second and third conductive layers are kept uncontaminated and enjoying satisfactory flatness, when the second and third conductive layers are pressed or pressed at a degree of temperature lower than the fusing point of a metal material made into the layers, a satisfactory metallic bond is attained. The metallic bond provides a state similar to a state resulting from fusion of metals (metals are fused at a degree of temperature equal to or higher than the fusing point in order to produce an alloy). As a layer of impurities is not produced, the resultant state of bond is analogous to the continuity of the same material. When the film 50 of an oxide or organic compound is produced, even if metals are pressed to each other, a stable metallic bond is not attained through pressure.

According to the tentative mounting method, metals are heated to the fusing points thereof. Thus, the temperatures of the metals are raised in order to activate superficial molecules, and metallic bond is attained through fusion of the metals including a layer of foreign matters. In this method, thermal deformation remains between the LSI element 12 and wiring board 14 and between the terminals 16 of the LSI element and the terminals 24 of the wiring board.

When the second conductive layer 20 and third conductive layer 26 are made of tungsten, if the tungsten layers are pressured and brought into close contact with each other while being held pure and uncontaminated (in a vacuum or an environment of an inert gas such as nitrogen), they are readily joined because they are made of the same material. As the molecular energy level of the uppermost layer is high, molecular binding occurs readily. In order to facilitate the molecular binding, temperature may be raised a little in order to raise the molecular energy level. In this case, the temperature need not be raised up to the fusing point of a metallic material for the purpose of fusion.

The LSI package 10 having been fabricated as mentioned above will neither undergo a thermal stress nor have a layer of impurities contained in an interface. Moreover, electrical resistance is low, and the wiring board 14 or LSI element 12 is free from a warp derived from a difference between coefficients of linear expansion. Stable bond can be attained even from a physical viewpoint.

Figure 9:
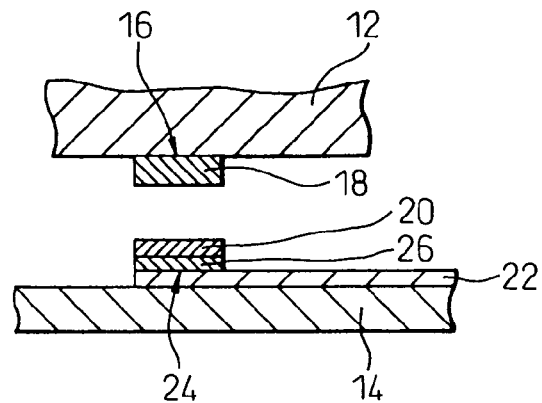
FIG. 9 shows a step of separating the LSI element from the wiring board.

FIG. 9 shows a step of separating an LSI element from a wiring board. After a test is completed, force is applied in a direction in which the LSI element 12 is separated from the wiring board 14. This causes the second conductive layers 20 of the pin terminals 16 of the LSI element 12 to stick to the third conductive layers 26 of the pin terminals 24 on the wiring board 14. The first conductive layers 18 alone are substantially left intact in the terminals 16 of the LSI element 12. Namely, the metallic bond between each of the second conductive layers 20 and each of the third conductive layers 26 is stronger than the metallic bond between each of the first conductive layers 18 and each of the second conductive layers 20. Specifically, the second conductive layers 20 are persistently joined with the third conductive layers 26 through agglutination. As the metallic bond between each of the first conductive layers 18 and each of the second conductive layers 20 is relatively weak, the second conductive layers 20 are stuck on to the wiring board 14. The first conductive layers 18 are left intact in the LSI element 12. Thus, the LSI element 12 is readily separated from the wiring board 14.

On the other hand, according to the tentative mounting method, it is not easy to peel off the pin terminals of an LSI element from the pin terminals of a wiring board. If the terminals are peeled off forcibly, the terminals of the LSI element are irregularly torn off from the terminals of the wiring board. Thereafter, the terminals are hardly used as terminals.

Figure 10:
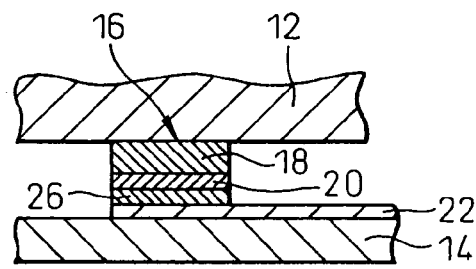
FIG. 10 shows an example of an LSI element in which second conductive layers are harder than first conductive layers.
Figure 11:
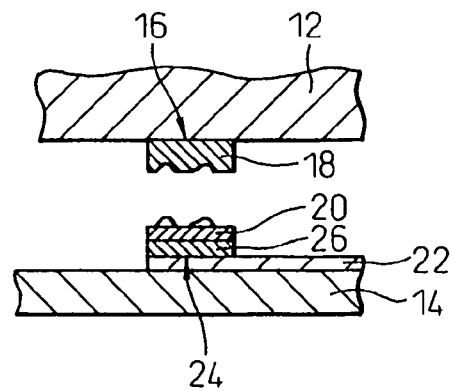
FIG. 11 shows a step of peeling off the LSI element shown in FIG. 10 from the wiring board.

FIG. 10 shows an example of the LSI element 12 in which the second conductive layers 20 of the pin terminals are harder than the first conductive layers 18 or the tensile strength of the second conductive layers is larger than the tensile strength of the first conductive layers. FIG. 11 shows a step of peeling off the LSI element shown in FIG. 11 from a wiring board. The first conductive layers 18 and second conductive layers 20 of the pin terminals 16 of the LSI element 12 are produced by performing sputtering and brought into close contact with each other on a planar basis. Electrical resistance such as constriction resistance will not be produced between the first conductive layer and second conductive layer.

When it is said that the material of the second conductive layers 20 is harder than the material of the first conductive layers 18, it means that the first conductive layers 18 are readily peeled off from the second conductive layers 20. The first conductive layers 18 are therefore left intact in the LSI element 12. The combination of aluminum and tungsten satisfies the requirements. If there is a fear that part of aluminum may adhere to tungsten and thus the volume of aluminum may decrease, an aluminum layer may be made thicker by several micrometers than the aluminum layer employed in wire bonding.

Figure 12:
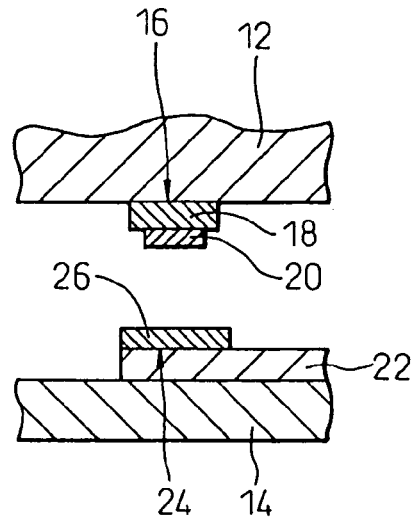
FIG. 12 shows an example of an LSI element in which second conductive layers are smaller than the third conductive layers included in the wiring board.

FIG. 12 shows an example of the LSI element in which the second conductive layers 20 of the pin terminals 16 of the LSI element 12 are smaller than the third conductive layers 26 of the pin terminals 24 of the wiring board 14. When the size of the second conductive layers 20 is smaller than that of the first conductive layers 18, the second conductive layers 20 are readily peeled off from the first conductive layers 18 at a later step. This will prove effective in that peeling brings about little residue.

Figure 13:
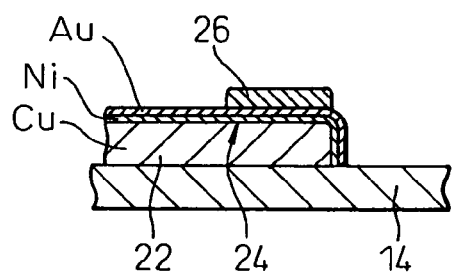
FIG. 13 is a sectional view showing an example of the structure of each of the terminals of the wiring board.

FIG. 13 is a sectional view showing an example of the structure of the pin terminals of a wiring board. The quality of a material made into the terminals 24 of the wiring board 14 may not be homogeneous. Namely, the third conductive layer 26 that is the uppermost layer to be brought into contact with the second conductive layer 20 of each of the pin terminals 16 of the LSI element-12 should merely be made of the same material as the second conductive layer 20 of each of the terminals of the LSI element 12 or a material exhibiting good wettability. In FIG. 13, the wire 22 has a structure of three layers of Cu, Ni, and Au, and a portion of the wire to be joined with one of the terminals 16 of the LSI element 12 is plated with tungsten (W) in order to produce the third conductive layer 26.

Figure 14:
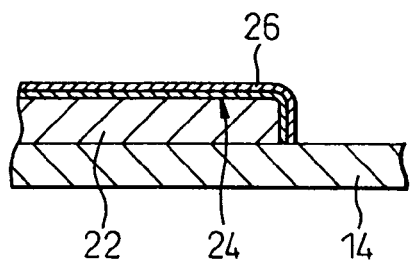
FIG. 14 shows another example of the structure of each of the terminals of the wiring board.

FIG. 14 shows another example of the structure of each of the pin terminals of a wiring board. In this example, the wire 22 has a two-layer structure and is plated with W over a relatively wide area in order to produce the third conductive layer 26.

Figure 15A:
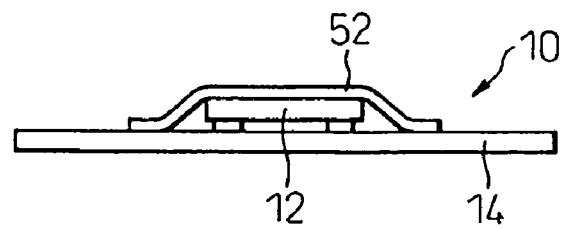
FIG. 15A to FIG. 15D show an example of an LSI package reinforced with a reinforcement member.

FIG. 15A to FIG. 15D show an example of an LSI package reinforced with a reinforcement member. In FIG. 15A, the LSI package 10 composed of the LSI element 12 and wiring board 14 is provided with a reinforcement member 52. The reinforcement member 52 is an adhesive that can be readily peeled off, such as a UV cured adhesive or a tape with the UV cured adhesive, and is used to assist in joining the LSI device and wiring board. The reinforcement member 52 is intended to reinforce the strength of the joint between the LSI package 12 and wiring board 14. During a test or at the time of delivery after completion of a test, the reinforcement member prevents the first conductive layers 18 and second conductive layers 20 from being readily peeled off from each other due to an impact or the like.

Figure 15B:
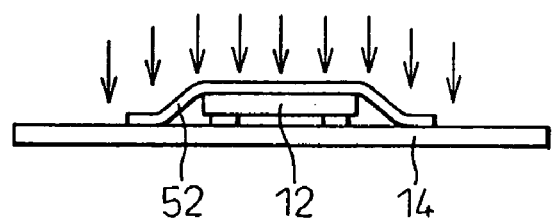
Figure 15C:
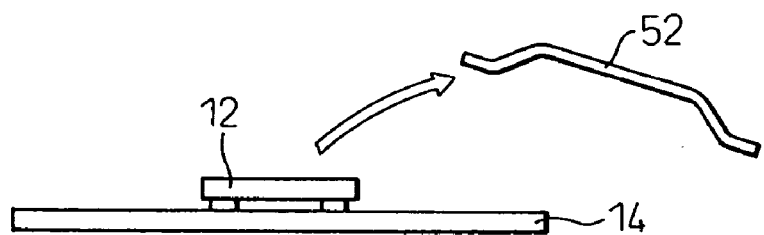
Figure 15D:
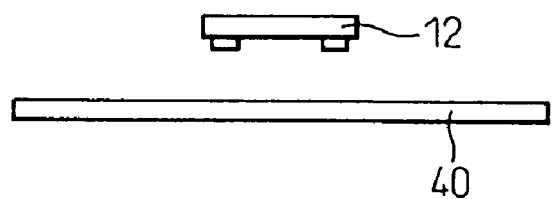

In FIG. 15B, before the LSI element 12 is separated from the wiring board 14, ultraviolet rays are irradiated in order to deprive the tape, which serves as the reinforcement member 52, of adhesion. In FIG. 15C, the reinforcement member 52 is peeled off from the LSI element 12 and wiring board 14. The LSI element 12 can be separated from the wiring board 14 but will not have a burden imposed thereon. In FIG. 15D, the LSI element 12 is mounted on another wiring board 40.

Figure 16:
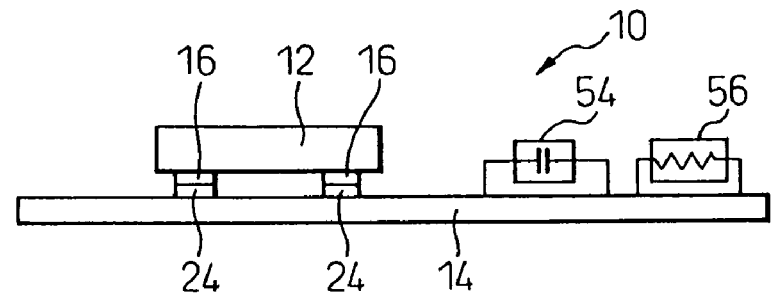
FIG. 16 shows another example of the LSI package.

FIG. 16 shows another example of an LSI package. An LSI package 10 comprises an LSI element 12 and a wiring board 14. Similarly to the example shown in FIG. 1 and FIG. 2, the LSI element 12 has a plurality of pin terminals 16 each including a first conductive layer 18 and a second conductive layer 20. The wiring board 14 has a plurality of pin terminals 24 each including a third conductive layer 26, and outer joining terminals 28. The conductive layers are identical to the aforesaid ones, though they are not shown in FIG. 16. Referring to FIG. 16, electronic parts 54 and 56 that support the action of the LSI element 12 or assist in testing the action of the LSI element 12 are mounted on the wiring board 14. For example, the electronic part 54 is a capacitor, and the electronic part 56 is a resistor. The electronic parts 54 and 56 may be any other members. Furthermore, an LSI having the capability to support a test may be included.

The wiring board 14 is reusable. The share of the electronic parts in the cost of each LSI element is therefore limited. Before the wiring board is reused, it is cleaned by performing ashing. Thus, foreign matters (aluminum, an oxide, or an organic compound) are removed from the surface of the wiring board.

Figure 17:
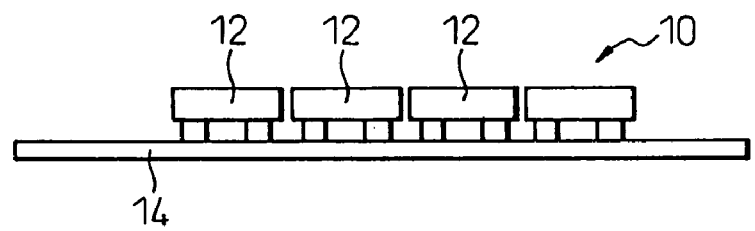
FIG. 17 shows another example of the LSI package.

FIG. 17 shows another example of an LSI package.

Figure 18:
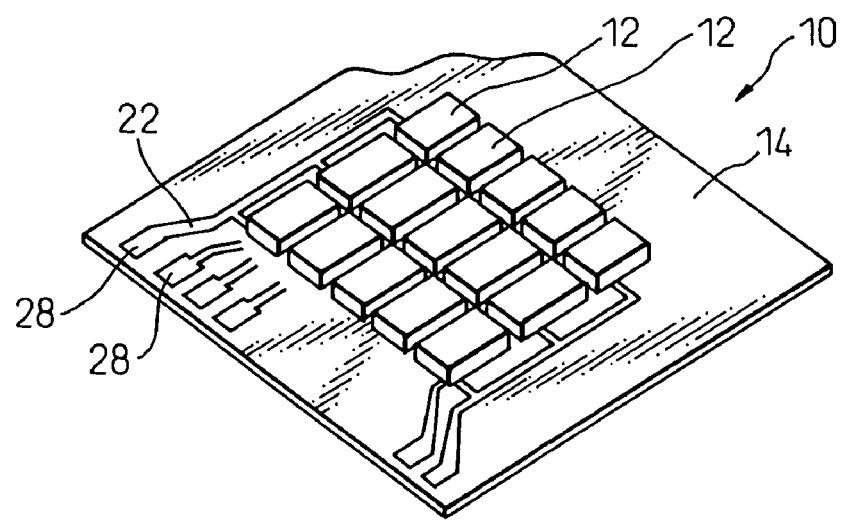
FIG. 18 is a perspective view showing the LSI package shown in FIG. 17.

FIG. 18 is a perspective view showing the LSI package shown in FIG. 17. An LSI package 10 comprises a plurality of LSI elements 12 and a wiring board 14. Each of the LSI elements 12 has a plurality of pin terminals each including a first conductive layer 18 and a second conductive layer 20. The wiring board 14 has a plurality of pin terminals 24 each including a third conductive layer 26, and outer joining terminals 28. The conductive layers are identical to the aforesaid ones, though they are not shown in FIG. 17 and FIG. 18.

Figure 19:
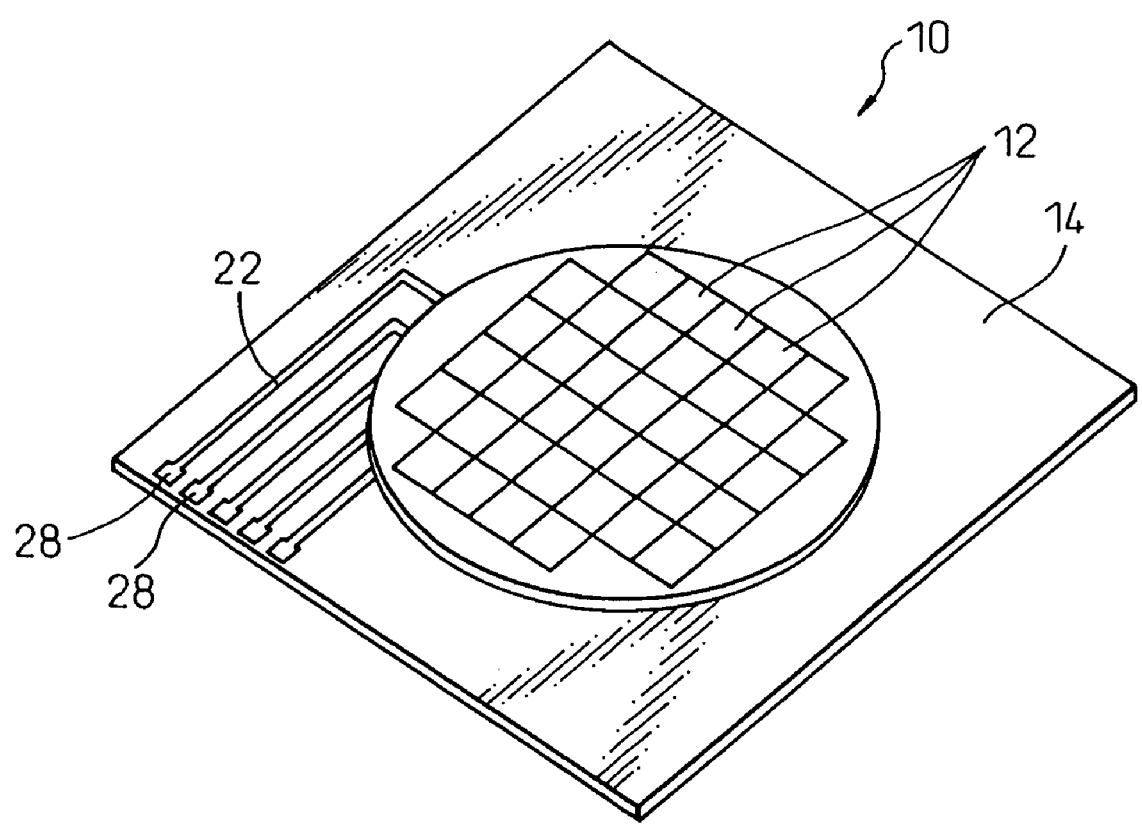
FIG. 19 is a perspective view showing another example of the LSI package.

FIG. 19 shows another example of an LSI package. An LSI package 10 comprises a plurality of LSI elements 12 and a wiring board 14. Each of the LSI elements 12 has a plurality of pin terminals 16 each including a first conductive layer 18 and a second conductive layer 20. The wiring board 14 has a plurality of pin terminals 24 each including a third conductive layer 26, and outer joining terminals 28. The conductive layers are identical to the aforesaid ones, through they are not shown in FIG. 19. The plurality of LSI elements 12 is integrated into a wafer. Incidentally, the plurality of LSI element 12 need not be mounted on the wiring board 14 in order to complete a perfect wafer. For example, the LSI elements may be mounted on the wiring board 14 in order to complete a half of a wafer or a quarter thereof.

Figure 20:
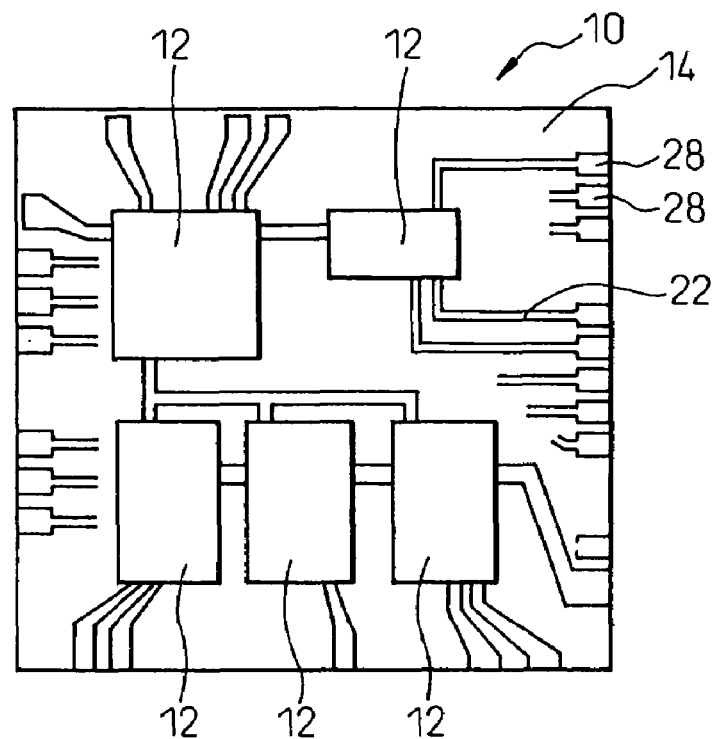
FIG. 20 is a plan view showing another example of the LSI package.
Figure 21:
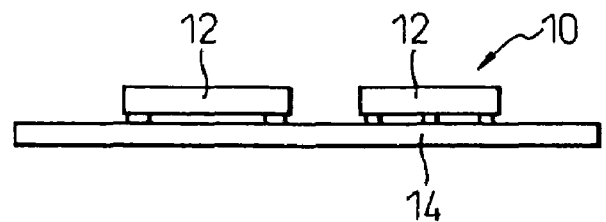
FIG. 21 is a side view showing the LSI package shown in FIG. 20.

FIG. 20 shows another example of an LSI package. FIG. 21 is a side view showing the LSI package shown in FIG. 20. An LSI package 10 comprises a plurality of LSI elements 12 and a wiring board 14. The plurality of LSI elements 12 includes two or more types of (mutually different) LSIs. For example, a chip serving as an MPU and a chip serving as a memory (flash memory or DRAM) may be mounted on the wiring board 14 and interconnected over required wires. Thus, the LSIs can be tested in the state of a system LSI (system package). Each of the LSI elements 12 has a plurality of pin terminals each including a first conductive layer 18 and a second conductive layer 20. The wiring board 14 has a plurality of pin terminals 24 each including a third conductive layer 26, and outer joining terminals 28. The conductive layers are identical to the aforesaid ones, though they are not shown in FIG. 17 and FIG. 18.

As described so far, according to the present invention, a known good die (KGD) can be provided readily and inexpensively. More specifically, for a test, stable electrical contact (low resistance) is attained without force. Moreover, after the test is completed, an LSI element can be freed readily. After the LSI element is freed, the pin terminals of the LSI element will not be deformed and the mounting capacity of the LSI element will not be impaired. With regard to an LSI to be mounted by bonding wires on aluminum pads, as the LSI will not have a flaw that is conventionally created during a preliminary test, the bonding capacity of the LSI will improve. Connection or separation can be achieved without high-temperature heat. The LSI element or the pin terminals of the LSI element will not be damaged.

The invention claimed is:

1. An LSI package comprising:
   at least one LSI element having a plurality of pin terminals; and
   a wiring board having a plurality of pin terminals, wherein:
   each of the plurality of terminals of the LSI element includes a first conductive layer and a second conductive layer superposed on the first conductive layer;
   each of the plurality of terminals of the wiring board includes a third conductive layer joined with the second conductive layer of each of the terminals of the LSI element;
   the first, second, and third conductive layers are made of materials causing the metallic bond between the second conductive layer and third conductive layer to be stronger than the metallic bond between the first conductive layer and second conductive layer; and
   the wiring board further includes a plurality of outer joining terminals connected to the plurality of pin terminals of the wiring board with wires.

2. An LSI package according to claim 1, wherein the second conductive layer of each of the terminals of the LSI element and the third conductive layer of each of the terminals of the wiring board are joined to attain metallic bond through aggregation derived from pressure.

3. An LSI package according to claim 2, wherein an interface on which the metallic bond is attained through aggregation derived from pressure does not contain a layer of impurities (an oxide or an organic compound) because the surfaces of the conductive layers that are cleaned before being pressured are joined to attain the metallic bond.

4. An LSI package according to claim 1, wherein the pitch between adjoining ones of the outer joining terminals of the wiring board is larger than the pitch between adjoining ones of the terminals of the LSI element.

5. An LSI package according to claim 1, wherein the hardness of a material made into the second conductive layer of each of the terminals of the LSI element is higher than the hardness of a material made into the first conductive layer.

6. An LSI package according to claim 1, wherein the tensile strength of the material made into the second conductive layer of each of the terminals of the LSI element is greater than the tensile strength of the material made into the first conductive layer.

7. An LSI package according to claim 6, wherein the reinforcement member includes an adhesive that can be peeled off.

8. An LSI package according to claim 1, wherein the second conductive layer of each of the terminals of the LSI element is smaller than the third conductive layer of each of the terminals of the wiring board.

9. An LSI package according to claim 1, wherein the LSI element and wiring board are further provided with a reinforcement member.

10. An LSI package according to claim 1, wherein an electronic part for supporting the action of the LSI element or assisting in testing the action of the LSI element is mounted on the wiring board.

11. An LSI element testing method comprising the steps of:
   providing an LSI element with a plurality of pin terminals each including a first conductive layer and a second conductive layer superposed on the first conductive layer;

forming on a wiring board a plurality of pin terminals each including a third conductive layer, and a plurality of outer joining terminals connected to the plurality of pin terminals with wires;

joining the plurality of terminals of the LSI element with the plurality of terminals of the wiring board so that the second conductive layers will be bonded to the third conductive layers; and testing the LSI element using the plurality of outer joining terminals of the wiring board, wherein:

the first, second, and third conductive layers are made of materials causing the metallic bond between the second conductive layer and third conductive layer to be stronger than the metallic bond between the first conductive layer and second conductive layer.

12. A semiconductor device manufacturing method comprising the steps of:

providing an LSI element with a plurality of pin terminals each including a first conductive layer and a second conductive layer superposed on the first conductive layer;

forming on a wiring board a plurality of pin terminals each including a third conductive layer, and a plurality of outer joining terminals connected to the plurality of pin terminals with wires;

joining the plurality of terminals of the LSI element with the plurality of terminals of the wiring board so that the second conductive layers will be bonded to the third conductive layers;

testing the LSI element using the plurality of outer joining terminals of the wiring board;

transporting the LSI element and wiring board to a position different from a position of testing;

peeling off the plurality of terminals of the LSI element from the plurality of terminals of the wiring board; and joining the plurality of terminals of the LSI element with the plurality of terminals of another wiring board, wherein:

the first, second, and third conductive layers are made of materials causing the metallic bond between the second conductive layer and third conductive layer to be stronger than the metallic bond between the first conductive layer and second conductive layer.

13. A semiconductor device manufacturing method according to claim 12, further comprising a step of cleaning at least the surfaces of the second conductive layers of the terminals of the LSI element and the surfaces of the third conductive layers of the terminals of the wiring board prior to the step of joining the plurality of terminals of the LSI element with the plurality of terminals of the wiring board.

14. A semiconductor device manufacturing method according to claim 13, wherein the cleaning step refers to an ashing step.

15. A semiconductor device manufacturing method according to claim 12, wherein at the step of joining the plurality of terminals of the LSI element with the plurality of terminals of the wiring board, the second conductive layers of the terminals of the LSI element and the third conductive layers of the terminals of the wiring board are joined to attain metallic bond through aggregation derived from pressure.

16. A semiconductor device manufacturing method according to claim 12, wherein at least at the transporting step, the LSI element and wiring board are further provided with a reinforcement member.

17. A semiconductor device manufacturing method according to claim 16, wherein the reinforcement member includes an adhesive that can be peeled off.

18. A semiconductor device manufacturing method according to claim 12, wherein at the step of joining the plurality of terminals of the LSI element with the plurality of terminals of another wiring board, the plurality of terminals of the LSI element is joined to the plurality of terminals of the wiring board by performing wire bonding.

19. A semiconductor device manufacturing method according to claim 18, wherein at the peeling step, the second conductive layers of the terminals of the LSI element are stuck on to the third conductive layers of the terminals of the wiring board, and the first conductive layers alone are substantially left intact in the respective terminals of the LSI element.

20. A semiconductor device manufacturing method according to claim 12, wherein at the step of joining the plurality of terminals of the LSI element with the plurality of terminals of another wiring board, the plurality of terminals of the LSI element is joined to the plurality of terminals of the wiring board via bumps.

* * * * *